(12) United States Patent
Wen et al.

(10) Patent No.: US 9,985,072 B1
(45) Date of Patent: May 29, 2018

(54) CMOS IMAGE SENSOR WITH DUAL DAMASCENE GRID DESIGN HAVING ABSORPTION ENHANCEMENT STRUCTURE

(71) Applicant: Taiwan Semiconductor Manufacturing Co., Ltd., Hsin-Chu (TW)

(72) Inventors: Chi-Yuan Wen, Tainan (TW); Chien Nan Tu, Kaohsiung (TW); Ming-Chi Wu, Kaohsiung (TW); Yu-Lung Yeh, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 15/469,782

(22) Filed: Mar. 27, 2017

Related U.S. Application Data (60) Provisional application No. 62/427,378, filed on Nov. 29, 2016.

(51) Int. Cl.
*H01L 31/062* (2012.01)
*H01L 31/113* (2006.01)
*H01L 27/146* (2006.01)

(52) U.S. Cl.
CPC ...... *H01L 27/14643* (2013.01); *H01L 27/146* (2013.01); *H01L 27/1463* (2013.01)

(58) Field of Classification Search
CPC ............. H01L 27/14643; H01L 27/146; H01L 27/1463

USPC ......................................... 257/291, 292, 294
See application file for complete search history.

(56) References Cited

U.S. PATENT DOCUMENTS

| 8,586,404 | B2 | 11/2013 | Huang et al. | |
| 8,736,006 | B1 | 5/2014 | Tsai et al. | |
| 8,928,052 | B2 * | 1/2015 | Engl | H01L 33/382 257/200 |

(Continued)

OTHER PUBLICATIONS

Munday, Jeremy. "Photonic Structured Solar Cells to Enhance Current and Voltage." SPIE Newsroom. DOI: 10.1117/2.1201405. 005471, May 19, 2014.

(Continued)

*Primary Examiner* — Thien F Tran
(74) *Attorney, Agent, or Firm* — Eschweiler & Potashnik, LLC (57) ABSTRACT

The present disclosure relates to an image sensor integrated chip having a grid structure that reduces crosstalk between pixel regions of an image sensor chip. In some embodiments, the integrated chip has an image sensing element arranged within a substrate. An absorption enhancement structure is disposed along the back-side of the substrate. A grid structure is arranged over the absorption enhancement structure. The grid structure defines an opening arranged over the image sensing element and extends from over the absorption enhancement structure to a location within the absorption enhancement structure. By having the grid structure extend into the absorption enhancement structure, the grid structure is able to reduce crosstalk between adjacent image sensing elements by blocking radiation reflected off of non-planar surfaces of the absorption enhancement structure from traveling to an adjacent pixel region.

20 Claims, 8 Drawing Sheets

(56) References Cited

U.S. PATENT DOCUMENTS

2013/0234202 A1   9/2013   JangJian et al.
2015/0141753 A1*  5/2015   Kanamori ......... H01L 27/14627
                                                       600/109

OTHER PUBLICATIONS

Zimmermann, Horst. "Integrated Silicon Optoelectronics—Chapter 1 Basics of Optical Emission and Absorption." pp. 1-9, ISBN: 978-3-642-01520-5, published in 2010.
Tian, et al. "Crosstalk Challenges: CMOS Sensor Design." Published Jan. 1, 2005. Retrieved from http://www.laserfocusworld.com/articles/print/volume-41/issue-1/features/cmos-detectors/crosstalk-challenges-cmos-sensor-design.html.

* cited by examiner

CMOS IMAGE SENSOR WITH DUAL DAMASCENE GRID DESIGN HAVING ABSORPTION ENHANCEMENT STRUCTURE

REFERENCE TO RELATED APPLICATION

This Application claims priority to U.S. Provisional Application No. 62/427,378 filed on Nov. 29, 2016, the contents of which is hereby incorporated by reference in its entirety.

BACKGROUND

Integrated circuits (IC) with image sensors are used in a wide range of modern day electronic devices, such as cameras and cell phones, for example. In recent years, complementary metal-oxide semiconductor (CMOS) image sensors have began to see widespread use, largely replacing charge-coupled devices (CCD) image sensors. Compared to CCD image sensors, CMOS image sensors are increasingly favored due to low power consumption, a small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

CMOS image sensors comprise a plurality of pixel regions respectively having an image sensing element. In many modern day image sensors, color filters are arranged over the image sensing elements of a CMOS image sensor. The color filters are configured to filter incident light provided to different image sensing elements within the CMOS image sensor. For example, a CMOS image sensor may have a first color filter configured to pass red light arranged over a first image sensing element, a second color filter configured to pass blue light arranged over a second image sensing element, etc.

In general, the number of pixel regions in CMOS image sensor (CIS) integrated chips has increased over time. As the number of pixel regions in a CIS integrated chip increases, the resolution of an image captured by the integrated chip also increases. However, as size of pixel regions gets smaller, pixel regions come closer together and crosstalk between adjacent pixel regions increases. Crosstalk occurs when incident light directed towards one pixel region is undesirably sensed by another pixel region, thereby degrading the quality of an image captured by a CIS integrated chip. It has been appreciated that intervening layers arranged between a color filter and an image sensing elements may increase crosstalk between adjacent pixel regions. This is because when adjacent intervening layers have different indices of refraction, the layers may refract (i.e., change in direction of propagation of a light wave) an incident light ray according to Fresnel's equation. If the interface is not planar, the refracted light may be travel in a lateral direction and ultimately be sensed by an adjacent image sensing element, thereby resulting in increased crosstalk.

The present disclosure relates to an image sensor integrated chip comprising a grid structure configured to reduce crosstalk between pixel regions of an image sensor chip. In some embodiments, the integrated chip comprises an image sensing element arranged within a substrate. An absorption enhancement structure is disposed along the back-side of the substrate. A grid structure is arranged over the absorption enhancement structure. The grid structure defines an opening arranged over the image sensing element and extends from over the absorption enhancement structure to a location within the absorption enhancement structure. By having the grid structure extend into the absorption enhancement structure, the grid structure is able to reduce crosstalk between adjacent image sensing elements by blocking and/or reflecting radiation reflected off of non-planar surfaces of the absorption enhancement structure to prevent the reflected radiation from traveling to an adjacent pixel region.

Figure 1:
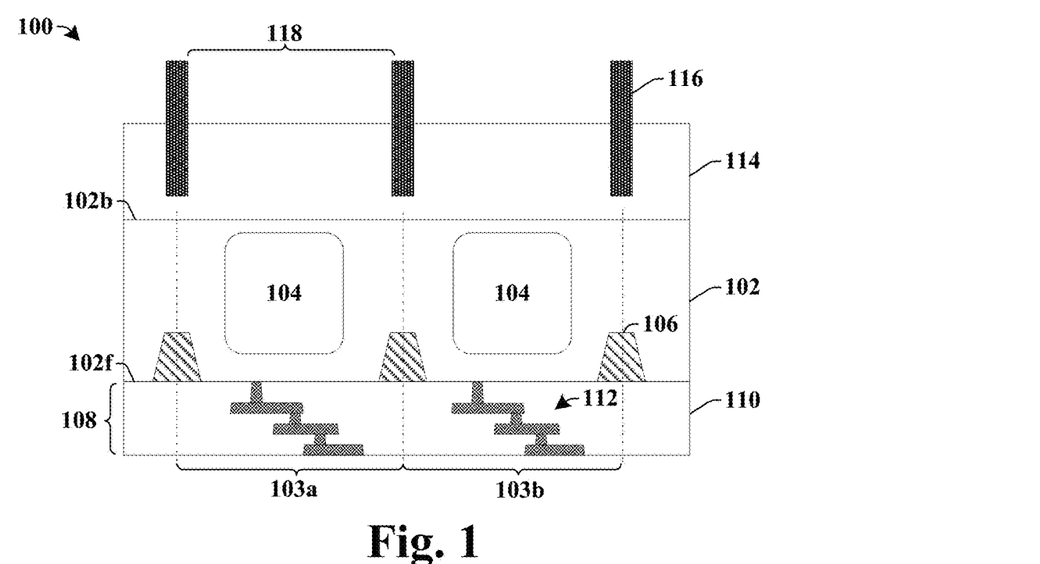
FIG. 1 illustrates a cross-sectional view of some embodiments of an image sensor integrated chip comprising a grid structure configured to reduce crosstalk between pixel regions.

FIG. 1 illustrates a cross-sectional view of some embodiments of an image sensor integrated chip 100 comprising a grid structure configured to reduce crosstalk between pixel regions.

The image sensor integrated chip 100 comprises a substrate 102 having a plurality of pixel regions 103a-103b. The plurality of pixel regions 103a-103b respectively comprising an image sensing element 104 configured to convert incident radiation (e.g., photons) into an electric signal (i.e., to generate electron-hole pairs from the incident radiation). In some embodiments, the image sensing element 104 may comprise a photodiode. The plurality of pixel regions 103a-103b may be arranged within the substrate 102 in an array comprising rows and/or columns. In some embodiments, the plurality of pixel regions 103a-103b may be separated by isolation structures 106 arranged within the substrate 102 at locations between adjacent ones of the plurality of pixel regions 103a-103b.

A back-end-of-the-line (BEOL) metallization stack 108 is arranged along a front-side 102f of the substrate 102. The BEOL metallization stack 108 comprises a dielectric structure 110 surrounding a plurality of metal interconnect layers 112. The dielectric structure 110 comprises a plurality of stacked inter-level dielectric (ILD) layers, while the plurality of metal interconnect layers 112 comprise alternating layers of conductive vias and conductive wires.

An absorption enhancement structure 114 is arranged along a back-side 102b of the substrate 102. The absorption enhancement structure 114 is configured to increase a quantum efficiency of the underlying image sensing element 104 by improving the absorption of photons by the image sensing element 104. In some embodiments, the absorption enhancement structure 114 may define a silicon nano-pillar array (NPA) or an array of photonic crystals.

A grid structure 116 protrudes outward from an upper surface of the absorption enhancement structure 114. The grid structure 116 comprises sidewalls that define an opening 118 overlying the image sensing element 104. The grid structure 116 vertically extends from over the absorption enhancement structure 114 to a location that is within the absorption enhancement structure 114. By extending into the absorption enhancement structure 114, the grid structure 116 is able to block radiation propagating along a lateral direction (i.e., parallel to the back-side 102b of the substrate 102) within the absorption enhancement structure 114. By blocking the lateral propagation of radiation within the absorption enhancement structure 114, the grid structure 116 is able to mitigate crosstalk between adjacent pixel regions, 103-103b, thereby improving performance of the image sensor integrated chip 100.

Figure 2:
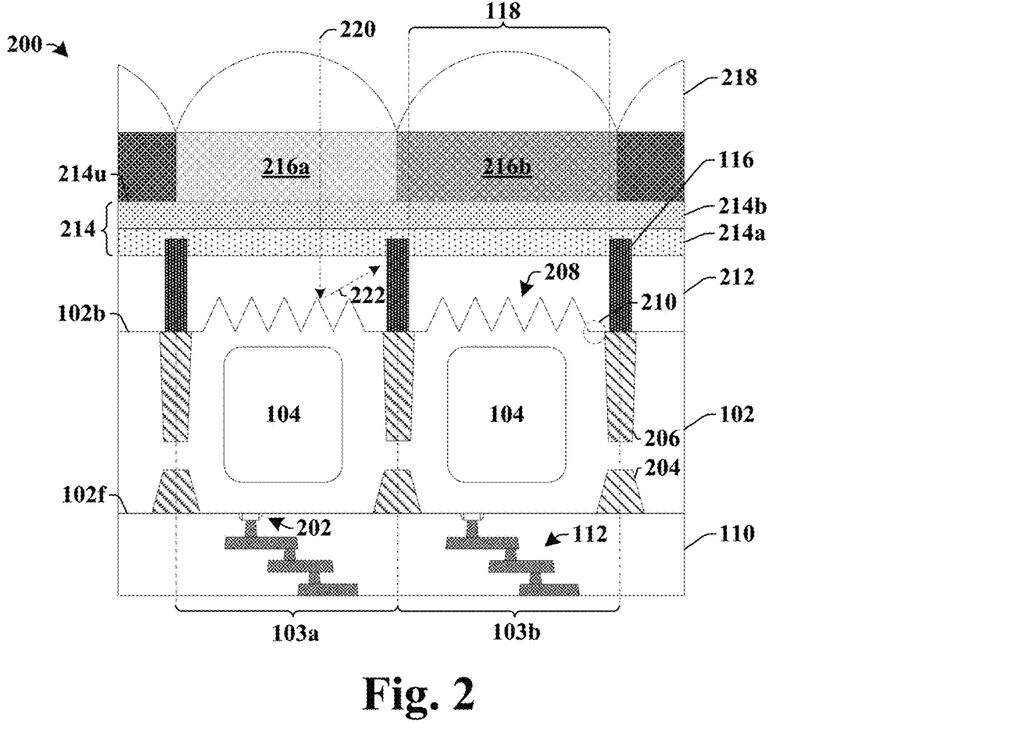
FIG. 2 illustrates a cross-sectional view of some additional embodiments of an image sensor integrated chip comprising a grid structure configured to reduce crosstalk between pixel regions.

FIG. 2 illustrates a cross-sectional view of some additional embodiments of an image sensor integrated chip 200 comprising a grid structure configured to reduce crosstalk between pixel regions.

The image sensor integrated chip 200 comprises a substrate 102 having a plurality of pixel regions 103a-103b respectively having an image sensing element 104 configured to convert incident radiation 220 into an electric signal. A plurality of transistor devices 202 are arranged along a front-side 102f of the substrate 102. A dielectric structure 110 comprising a plurality of metal interconnect layers 112 is also arranged along the front-side 102f of the substrate 102. The plurality of metal interconnect layers 112 are electrically coupled to the plurality of transistor devices 202. The dielectric structure 110 comprises one or more stacked inter-level dielectric (ILD) layers. In various embodiments, the ILD layers may comprise one or more of a low-k dielectric layer (i.e., a dielectric with a dielectric constant less than about 3.9), an ultra low-k dielectric layer, or an oxide (e.g., silicon oxide). The plurality of metal interconnect layers 112 comprise alternating layers of metal wires and metal vias. In various embodiments, the plurality of metal interconnect layers 112 may comprise a conductive metal such as copper, aluminum, and/or tungsten, for example.

An absorption enhancement structure 212 is arranged along a back-side 102b of the substrate 102. In some embodiments, the back-side 102b of the substrate 102 may comprise a non-planar surface. For example, in some embodiments, the back-side 102b of the substrate 102 may comprise a non-planar surface defining a plurality of depressions 208 arranged in a periodic pattern, while the absorption enhancement structure 212 comprises a plurality of protrusions arranged within a periodic pattern and extending within the depressions 208. In other embodiments, the back-side 102b of the substrate 102 may comprise a non-planar surface defining a plurality of protrusions arranged in a periodic pattern, while the absorption enhancement structure 212 comprises a plurality of depressions arranged within a periodic pattern and surrounding the protrusions.

In some embodiments, the plurality of depressions 208 comprise tapered depressions (i.e., depressions having one or more tapered sidewalls) disposed in a periodic pattern overlying the image sensing element 104. For example, the plurality of depressions 208 may comprise cones or pyramids (e.g., having an n-sided base, wherein n=3, 4, 5, 6, . . . ) shaped depressions arranged over the image sensing element 104. In such embodiments, the plurality of depressions 208 may have a saw-tooth shaped profile that alternates between peaks and valleys. In other embodiments, the plurality of depressions 208 may comprise other shapes, such as cylinders, for example. In some embodiments, the saw-tooth profile may be arranged between planar ledges 210 arranged along a perimeter of the pixel regions, 103a-103b. In some embodiments, the absorption enhancement structure 212 may comprise epitaxial silicon and/or another semiconductor material. In other embodiments, the absorption enhancement structure 212 may comprise a dielectric material (e.g., $SiO_2$).

The topography of the absorption enhancement structure 212 increases absorption of radiation by the substrate 102. By increasing the absorption of radiation by the substrate 102, the quantum efficiency (e.g., a ratio of a number of carriers generated by an image sensor to the number of photons incident on the image sensor at a given energy/wavelength) of the underlying image sensing element 104 can be improved. For example, the absorption enhancement structure 212 may improve peak quantum efficiencies by up to approximately 40% within the visible spectrum of light.

In some embodiments, the absorption enhancement structures 212 may define a silicon nano-pillar array (Si-NPA). In contrast to crystalline silicon, which is an indirect band gap semiconductor that is unable to absorb photons without the generation or consumption of a phonon (due to conservation of momentum), the silicon nano-pillar array may be a direct band-gap semiconductor due to the quantum confinement effect of the carriers in silicon nanocrystallites of the Si-NPA. The direct band gap semiconductor of the Si-NPA is able to directly absorb photons thereby increasing an efficiency of the image sensing element. In some such embodiments, the image sensing element 104 may extend to a position that contacts the Si-NPA.

In other embodiments, the absorption enhancement structure 212 may be configured to act as a two-dimensional photonic crystal array that traps photons transmitted to the substrate 102. For example, an absorption enhancement structure 212 comprising two-dimensional photonic crystals blocks the transmission of photons into and out of the substrate 102 by selectively transmitting photons within a certain energy range (e.g., having a certain range of wavelengths), while blocking the transmission of photons outside of the energy range. The two-dimensional photonic crystal can be used to transmit photons to the substrate 102 and to block reemitted photons, thereby effectively trapping reemitted photons inside the substrate 102. The trapped photons are subsequently reabsorbed by the substrate 102 (e.g., when a phonon is generated or absorbed), which increases the absorption.

A grid structure 116 protrudes outward from an upper surface of the absorption enhancement structure 212. The grid structure 116 comprises sidewalls that define an opening 118 overlying the image sensing element 104. The grid structure 116 vertically extends from a top surface over the absorption enhancement structure 212 to a bottom surface within the absorption enhancement structure 212. In some embodiments, the grid structure 116 may have a bottom surface that is below an uppermost point of the substrate 102 (e.g., a peak of the substrate 102). In some embodiments, the bottom surface of the grid structure 116 is substantially aligned with the planar ledges 210 arranged along the perimeter of the pixel regions 103a-103b.

In some embodiments, the grid structure 116 may comprise a conductive material such as a metal (e.g., aluminum, cobalt, copper, silver, gold, tungsten, etc.). In other embodiments, the grid structure 116 may comprise a non-metallic material. In some embodiments, the grid structure 116 may comprise a material configured to reflect radiation (e.g., a metal such as gold, silver, copper, etc.). In such embodiments, the grid structure 116 may reflect radiation refracted from the absorption enhancement structure 212 back towards the image sensing element 104, thereby increasing a quantum efficiency associated with the image sensing element 104. In some embodiments, the grid structure 116 can increase a peak quantum efficiency associated with an image sensing element 104 by up to approximately 5% in green and/or red regions of the electromagnetic spectrum relative to an image sensor integrated chip having a grid structure arranged completely over an underlying absorption enhancement structure (or by up to approximately 30-40% relative to image sensor integrated chips not having an absorption enhancement structure). For example, the disclosed grid structure 116 may increase a peak quantum efficiency within the green region of the electromagnetic spectrum from approximately 77% to approximately 80%. In other embodiments, the increase in peak quantum efficiency may be larger or smaller. It will be appreciated that the grid structure 116 can also increase peak quantum efficiencies in other regions of the electromagnetic spectrum, such as, for example, in the near infrared (NIR) regions of the electromagnetic spectrum (i.e., for electromagnetic radiation having wavelengths between approximately 700 nm and approximately 1400 nm).

In some embodiments, a dielectric planarization structure 214 may be arranged over the absorption enhancement structure 212. The dielectric planarization structure 214 has a substantially planar upper surface 214u. In various embodiments, the dielectric planarization structure 214 may comprise one or more stacked dielectric layers, 214a-214b. For example, in some embodiments, the dielectric planarization structure 214 may comprise a first dielectric layer 214a comprising a first material and a second dielectric layer 214b stacked onto the first dielectric layer 214a and comprising a second material. In some embodiments, the first material and/or the second material may comprise an oxide (e.g., $Si_{O2}$) or a nitride, for example. In some embodiments, the grid structure 116 may extend into at least one of the one or more stacked dielectric layers, 214a-214b. In some embodiments, the grid structure 116 may extend into a first dielectric layer 214a, but not into second dielectric layer 214b (so that the grid structure 116 has a top surface covered by the first dielectric layer 214a).

A plurality of color filters, 216a-216b, are arranged over the back-side 102b of the substrate 102. The plurality of color filters, 216a-216b, are respectively configured to transmit specific wavelengths of incident radiation 220. For example, a first color filter 216a may transmit radiation having wavelengths within a first range, while a second color filter 216b may transmit radiation having wavelengths within a second range different than the first range. A plurality of micro-lenses 218 are arranged over the plurality of color filters, 216a-216b. Respective micro-lenses 218 are laterally aligned with the color filters, 216a-216b, and overlie the pixel regions 103a-103b.

The plurality of micro-lenses 218 are configured to focus the incident radiation 220 (e.g., light) towards the pixel regions 103a-103b. When the incident radiation 220 strikes an interface between the absorption enhancement structure 212 and the substrate 102, a portion of the incident radiation 220 is refracted as refracted radiation 222, which travels at an angle that is different than that of the incident radiation 220. The grid structure 116 within the absorption enhancement structure 212 is configured to block the refracted radiation 222 from traveling to an adjacent pixel region, thereby reducing crosstalk between adjacent pixel regions 103a-103b. For example, the grid structure 116 blocks refracted radiation 222 generated within a first pixel region 103a from traveling to a second pixel region 103b.

By blocking the lateral propagation of refracted radiation 222 within the absorption enhancement structure 212, the grid structure 116 is able to mitigate crosstalk between adjacent pixel regions, 103-103b, thereby improving performance of the image sensor integrated chip 200. For example, in some embodiments, the grid structure 116 can provide the image sensor integrated chip 200 with a crosstalk that is reduced by up to approximately 50% within the visible spectrum (i.e., a range of wavelengths between approximately 400 nm and approximately 700 nm) relative to an image sensor integrated chip having a grid structure arranged completely over an underlying absorption enhancement structure. In some embodiments, the grid structure 116 may provide the image sensor integrated chip 200 with a level of crosstalk that is substantially equal to (e.g., within less than approximately 1%) an image sensor integrated chip having no absorption enhancement structure.

Since crosstalk has a deleterious effect on a resolution of an image sensor, the reduction in crosstalk can improve the resolution of the image sensor integrated chip 200. For example, the reduction in crosstalk can improve a modulation transfer function (MTF) of the image sensor integrated chip 200 by up to approximately 40% (relative to an image sensor integrated chip having a grid structure arranged completely over an underlying absorption enhancement structure). Therefore, the disclosed grid structure 116 is able to provide for an image sensor integrated chip having both a high quantum efficiency and MTF.

Figure 3:
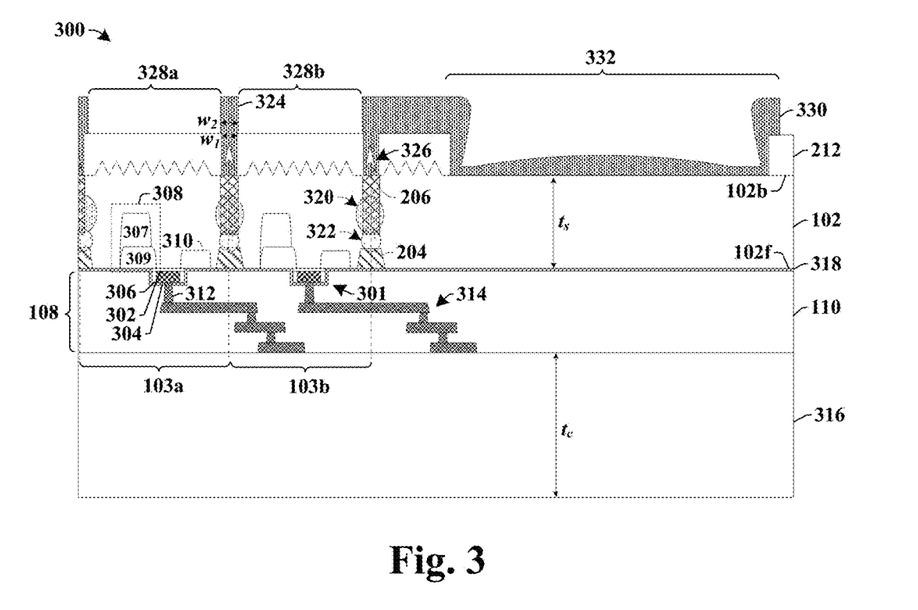
FIG. 3 illustrates a cross-sectional view of some embodiments of a CMOS image sensor (CIS) integrated chip comprising a grid structure configured to reduce crosstalk between pixel regions.

FIG. 3 illustrates a cross-sectional view of some additional embodiments of a CMOS image sensor (CIS) integrated chip 300 having a grid structure configured to reduce crosstalk between pixels.

The CIS integrated chip 300 comprises a plurality of gate structures 301 arranged along a front-side 102f of a substrate 102. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

In some embodiments, the plurality of gate structures 301 may correspond to a transfer transistor, a source-follower transistor (not shown), a row select transistor (not shown), and/or a reset transistor (not shown). The plurality of gate structures 301 have a gate dielectric layer 302 disposed along the front-side 102f of the substrate 102 and a gate electrode 304 arranged on the gate dielectric layer 302. In some embodiments, sidewall spacers 306 are arranged on opposing sides of the gate electrode 304.

In some embodiments, a gate structure 301 corresponding to a transfer transistor is laterally arranged between a photodiode 308 and a floating diffusion well 310. In such embodiments, the photodiode 308 may comprise a first region 307 within the substrate 102 having a first doping type (e.g., n-type doping) and an adjoining second region 309 within the substrate 102 having a second doping type (e.g., p-type doping) that is different than the first doping type. The gate structure 301 is configured to control the transfer of charge from the photodiode 308 to the floating diffusion well 310. If the charge level is sufficiently high within the floating diffusion well 310, the source-follower transistor (not shown) is activated and charges are selectively output according to operation of a row select transistor (not shown) used for addressing. The reset transistor (not shown) is configured to reset the photodiode 308 between exposure periods.

A BEOL metallization stack 108 is also arranged along the front-side 102f of the substrate 102. The BEOL metallization stack 108 comprises a conductive contact 312 arranged in electrical contact with the gate electrode 304. The conductive contact 312 is further coupled to one or more additional metal interconnect layers 314 arranged in a dielectric structure 110. The dielectric structure 110 is separated from the substrate 102 by way of a contact etch stop layer 318. In some embodiments, the dielectric structure 110 is coupled to a carrier substrate 316. The carrier substrate 316 is configured to provide for structural support to the CIS integrated chip 300. The carrier substrate 316 has a thickness $t_c$ that is greater than a thickness $t_s$ of the substrate 102. In some embodiments, the carrier substrate 316 may comprise silicon.

A plurality of shallow trench isolation (STI) structures 204 are arranged within a front-side 102f of the substrate 102 and a plurality of back-side deep trench isolation (BDTI) structures 206 are arranged within a back-side 102b of the substrate 102. The plurality of STI structures 204 are located on opposing sides of a pixel region, 103a-103b, and are configured to provide isolation between adjacent pixel regions, 103a-103b. The plurality of STI structures 204 comprise one or more dielectric materials (e.g., $SiO_2$) arranged within trenches in the front-side 102f of the substrate 102. The plurality of back-side deep trench isolation (BDTI) structures 206 extend from the back-side 102b of the substrate 102 to a position overlying the plurality of STI structures 204. The plurality of BDTI structures 206 comprise one or more dielectric materials (e.g., $SiO_2$) arranged within trenches in the back-side 102b of the substrate 102. In some embodiments, respective ones of the plurality of BDTI structures 206 may have a width that is smaller than a width of a respective one of the plurality of STI structures 204.

One or more isolation well regions may be arranged between adjacent pixel regions 103a-103b to provide for additional isolation. In some embodiments, the one or more isolation well regions may comprise a deep-well region 320 and a cell-well region 322. The deep-well region 320 is arranged in the substrate 102 at a location laterally aligned with the STI structure 204 and the BDTI structure 206. A cell-well region 322 is arranged in the substrate 102 at a location vertically between the deep-well region 320 and the STI structure 204. The deep-well region 320 and the cell-well region 322 may have one or more doping types that provide further isolation between adjacent pixel regions, 103a-103b, by way of junction isolation.

An absorption enhancement structure 212 is arranged along a back-side 102b of the substrate 102. A grid structure 324 is disposed directly over the BDTI structure 206 and vertically extends from within the absorption enhancement structure 212 to over the absorption enhancement structure 212. The grid structure 324 comprises sidewalls that define openings, 328a-328b, overlying the pixel regions, 103a-103b. In some embodiments, the grid structure 324 may comprise a first width $w_1$ within the absorption enhancement structure 212 and a second width $w_2$, which is larger than the first width $w_1$, above the absorption enhancement structure 212. In some embodiments, a difference between the first width $w_1$ and the second width $w_2$ may cause the grid structure 324 to have horizontal surfaces that contact an upper surface of the absorption enhancement structure 212.

In some embodiments, the grid structure 324 may have interior surfaces that define one or more voids 326 arranged over the BDTI structure 206. The voids 326 are regions that are devoid of a conductive material of the grid structure 324. In some embodiments, the one or more voids 326 are arranged between sidewalls of the absorption enhancement structure 212. In some embodiments, the one or more voids 326 vertically straddle an uppermost point of the substrate 102.

A ground region 332 is disposed at a location laterally offset from the pixel regions, 103a-103b. The ground region 332 comprises a ground structure 330 comprising a conductive layer extending through the absorption enhancement structure 212 to the substrate 102. During fabrication of the CIS integrated chip 300, ions (e.g., from a dry etching process) striking the grid structure 324 may generate charges, which build up within the substrate 102. The ground region 332 is configured to enable the discharge of built-up charges, thereby improving performance of the CIS integrated chip 300. In some embodiments, the conductive layer of the ground structure 330 has a bottom surface that is substantially aligned with a lower surface of the grid structure 324 along a line parallel to the substrate surface.

FIGS. 4-13 illustrate cross-sectional views of some embodiments of a method of forming an image sensor integrated chip comprising a grid structure configured to reduce crosstalk between pixel regions.

Figure 4:
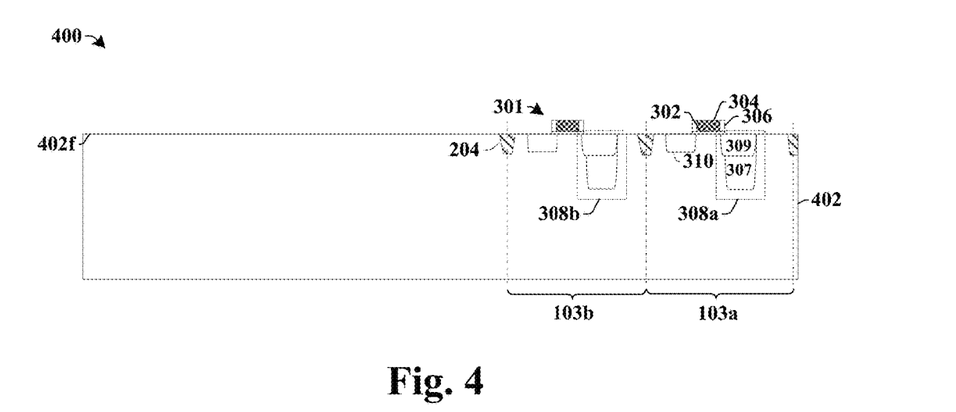
FIGS. 4-13 illustrate cross-sectional views of some embodiments of a method of forming an image sensor integrated chip comprising a grid structure configured to reduce crosstalk between pixel regions.

As shown in cross-sectional view 400 of FIG. 4, image sensing elements are respectively formed within pixel regions 103a-103b of a substrate 402. In some embodiments, the image sensing elements may comprise photodiodes 308a-308b. The photodiodes 308a-308b may be formed by implanting one or more dopant species into a front-side 402f of the substrate 402. For example, the photodiodes 308a-308b may be formed by selectively performing a first implantation process to form a first region 307 having a first doping type (e.g., n-type), and subsequently performing a second implantation process to form a second region 309 abutting the first region 307 and having a second doping type (e.g., p-type) different than the first doping type. In some embodiments, the first region 307 may vertically abut the second region 309. In some embodiments, the substrate 402 may be selectively implanted according to a masking layer (not shown). In some embodiments a floating diffusion well 310 may also be formed using one of the first or second implantation processes. In other embodiments, the floating diffusion well 310 may be formed by a separate implantation process.

One or more gate structures 301 are formed along the front-side 402f of the substrate 402 within the pixel regions 103a-103b. In some embodiments, the one or more gate structures 301 may correspond to a transfer transistor, a source-follower transistor (not shown), a row select transistor (not shown), and a reset transistor (not shown). In some embodiments, the one or more gate structures 301 may be formed by depositing a gate dielectric film and a gate electrode film on the front-side 402f of the substrate 402. The gate dielectric film and the gate electrode film are subsequently patterned to form a gate dielectric layer 302 and a gate electrode 304. Sidewall spacers 306 may be formed on the outer sidewalls of the gate electrode 304. In some embodiments, the sidewall spacers 306 may be formed by depositing nitride onto the front-side 402f of the substrate 402 and selectively etching the nitride to form the sidewall spacers 306.

In some embodiments, one or more shallow trench isolation (STI) structures 204 may be formed within the front-side 402f of the substrate 402 on opposing sides of the pixel regions 103a-103b. The one or more isolation structures 204 may be formed by selectively etching the front-side 402f of the substrate 402 to form trenches and subsequently forming one or more dielectric materials within the trenches. In some embodiments, the one or more isolation structures 204 may be formed prior to formation of the one or more gate structures 301, the photodiodes, 308a-308b, and/or the floating diffusion well 310.

Figure 5:
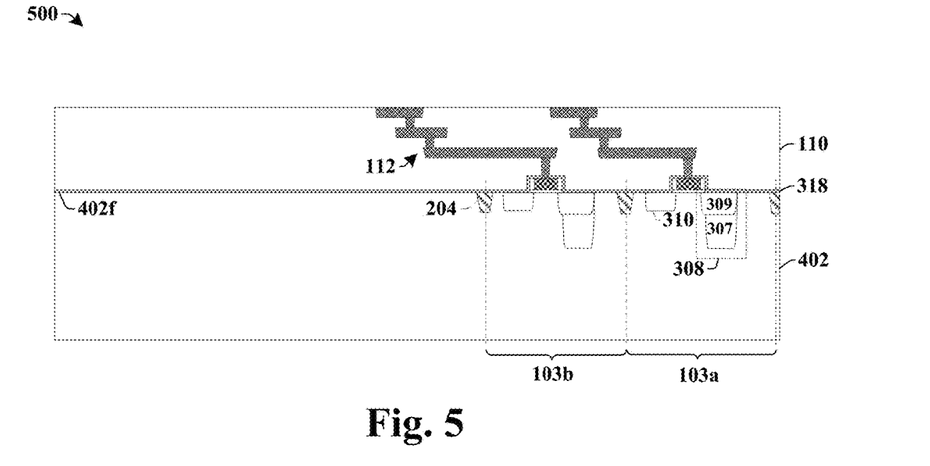

As shown in cross-sectional view 500 of FIG. 5, a plurality of metal interconnect layers 112 are formed within a dielectric structure 110 formed along the front-side 402f of the substrate 402. In some embodiments, the plurality of metal interconnect layers 112 may be formed by forming an ILD layer over the front-side 402f of the substrate 402, subsequently etching the ILD layer to form a via hole and/or a metal trench, and filling the via hole and/or metal trench with a conductive material. In some embodiments, a contact etch stop layer 318 may be formed over the gate structures 301 and/or substrate 402 prior to the formation of the dielectric structure 110. In some embodiments, the ILD layer may be deposited by a physical vapor deposition technique (e.g., PVD, CVD, PE-CVD, ALD, etc.) and the conductive material may be formed using a deposition process and/or a plating process (e.g., electroplating, electro-less plating, etc.). In various embodiments, the plurality of metal interconnect layers may comprise tungsten, copper, or aluminum copper, for example.

Figure 6:
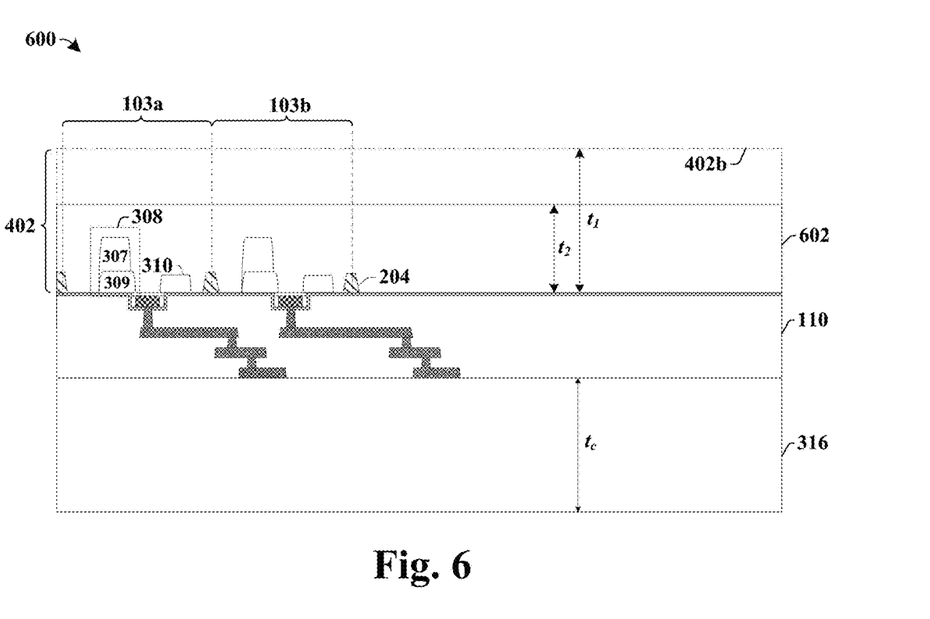

As shown in cross-sectional view 600 of FIG. 6, a thickness of the substrate 402 is reduced to form substrate 602. Thinning the substrate 402 reduces a thickness of the substrate 402 from a first thickness $t_1$ to a second thickness $t_2$ to allow for radiation to pass through the back-side of the substrate 602 to the photodiodes 308. In some embodiments, the substrate 402 may be thinned by etching a back-side 402b of the substrate 402. In other embodiments, the substrate 402 may be thinned by mechanically grinding the back-side 402b of the substrate 402.

In some embodiments, the dielectric structure 110 is bonded to a carrier substrate 316 prior to thinning the substrate 402. In some embodiments, the bonding process may use an intermediate bonding oxide layer (not shown) arranged between the dielectric structure and the handle substrate. In some embodiments, the bonding process may comprise a fusion bonding process. In some embodiments, the carrier substrate 316 may comprise a silicon wafer. In some embodiments, the carrier substrate 316 may have a thickness $t_c$ that is greater than the second thickness $t_2$ of the substrate 602 after thinning.

Figure 7:
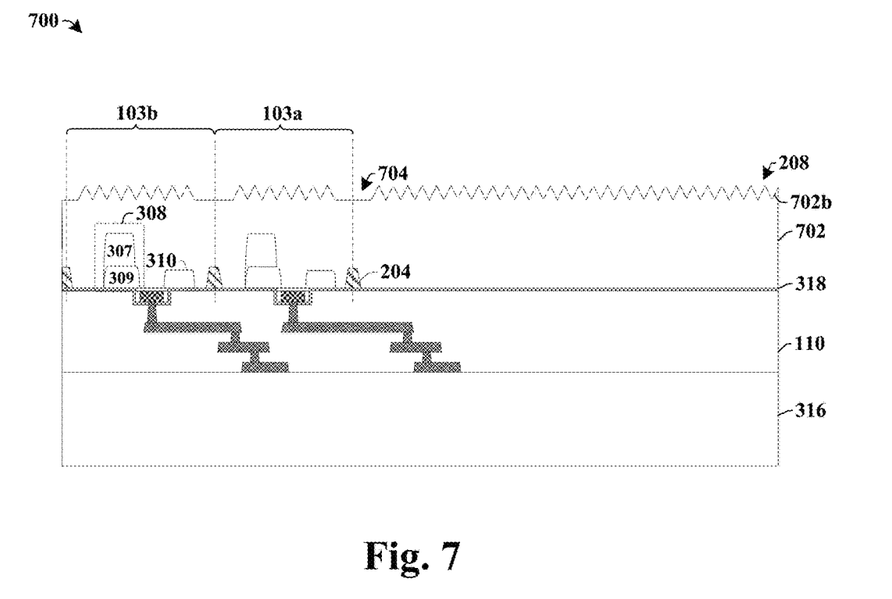

As shown in cross-sectional view 700 of FIG. 7, a non-planar surface is formed along a back-side 702b of the substrate 702. The non-planar surface has a plurality of depressions 208 and/or protrusions arranged in a periodic pattern overlying the image sensing element 104. In some embodiments, the plurality of depressions 208 and/or protrusions may be formed by selectively etching the back-side 702b of the substrate 702. In some embodiments, the plurality of depressions 208 comprise tapered depressions (i.e., depressions having one or more tapered sidewalls that meet at a point) disposed in a periodic pattern overlying the image sensing element 104. In some embodiments, the plurality of protrusions may comprise tapered protrusions (i.e., protrusions having one or more tapered sidewalls that meet at a point) disposed in a periodic pattern overlying the image sensing element 104. In some embodiments, substantially planar surfaces 704 may be formed along the back-side 702b of the substrate 702 between adjacent pixel regions 103a-103b. In some embodiments, the substantially planar surfaces 704 may be recessed below top surfaces of the protrusions. In other embodiments (not shown), the substantially planar surfaces 704 may be at or above the top surfaces of the protrusions (e.g., a long a top of a ridge adjacent to the protrusions).

Figure 8:
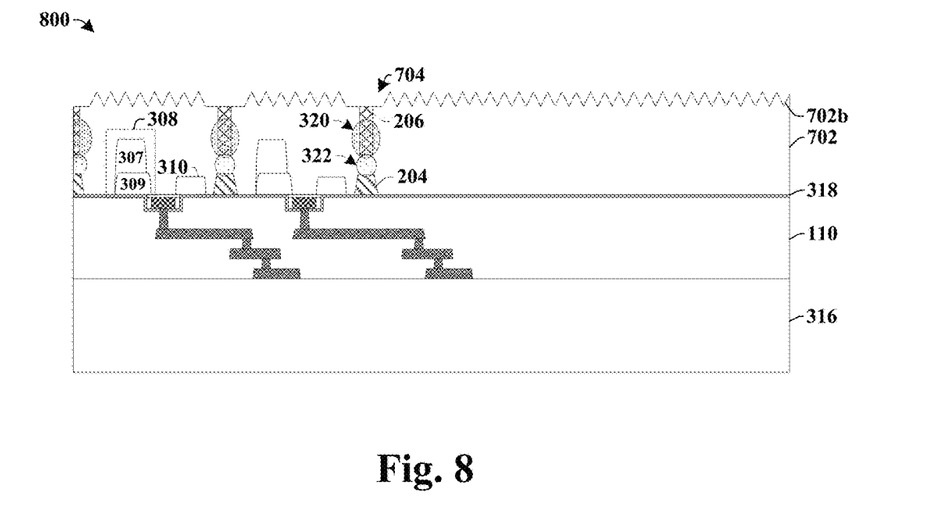

As shown in cross-sectional view 800 of FIG. 8, back-side deep trench isolation (BDTI) structures 206 are formed within the back-side 702b of the substrate 702. In some embodiments, the BDTI structures 206 are formed by selectively etching the back-side 702b of the substrate 702 to form deep trenches within the back-side 702b of the substrate 702. In some embodiments, the back-side 702b of the substrate 702 may be etched by exposing the back-side 702b of the substrate 702 to an etchant in regions not covered by a masking layer. The deep trenches are subsequently filled with one or more dielectric materials. In some embodiments, the BDTI structures 206 may be formed within the substantially planar surfaces 704 of the substrate 702 between adjacent pixels regions 103a-103b.

In some embodiments, one or more isolation well regions may be formed within the substrate 702 between adjacent pixels regions 103a-103b to provide additional isolation. In some embodiments, the one or more isolation well regions may comprise a deep-well region 320 and a cell-well region 322. The deep-well region 320 may be formed by performing a first isolation implantation process to selectively provide a dopant species at a location laterally aligned with the STI structure 204 and the BDTI structure 206. The cell-well region 322 may be formed by performing a second isolation implantation process to selectively provide a dopant species at a location vertically between the deep-well region 320 and the STI structure 204. In some embodiments, the first and second isolation implantation processes may implant dopant species having a doping type that is different than a doping type of an adjacent region of the substrate 102.

Figure 9:
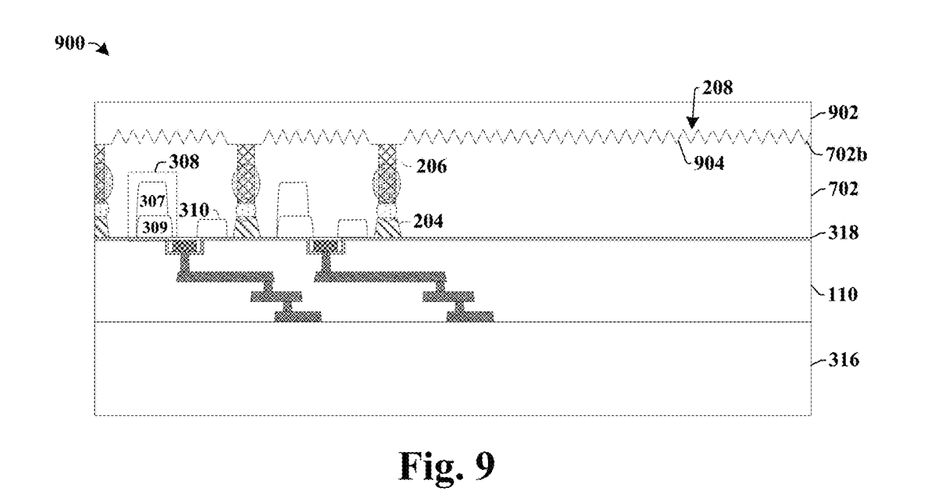

As shown in cross-sectional view 900 of FIG. 9, an absorption enhancement structure 902 is formed over the back-side 702b of the substrate 702. The absorption enhancement structure 902 may be formed by depositing a semiconductor (e.g., silicon, silicon-germanium, gallium arsenide, etc.) or dielectric material (e.g., silicon oxide, TEOS, etc.) onto the back-side of the substrate 702. In various embodiments, the absorption enhancement structure 902 may comprise a plurality of protrusions 904 and/or depressions. The plurality of protrusions 904 may extend to with the depressions 208 within the back-side 702b of the substrate 702. In some embodiments, a planarization process (e.g., a chemical mechanical planarization process) may be performed after depositing the semiconductor or dielectric material to give the absorption enhancement structure 902 a substantially planar upper surface.

Figure 10:
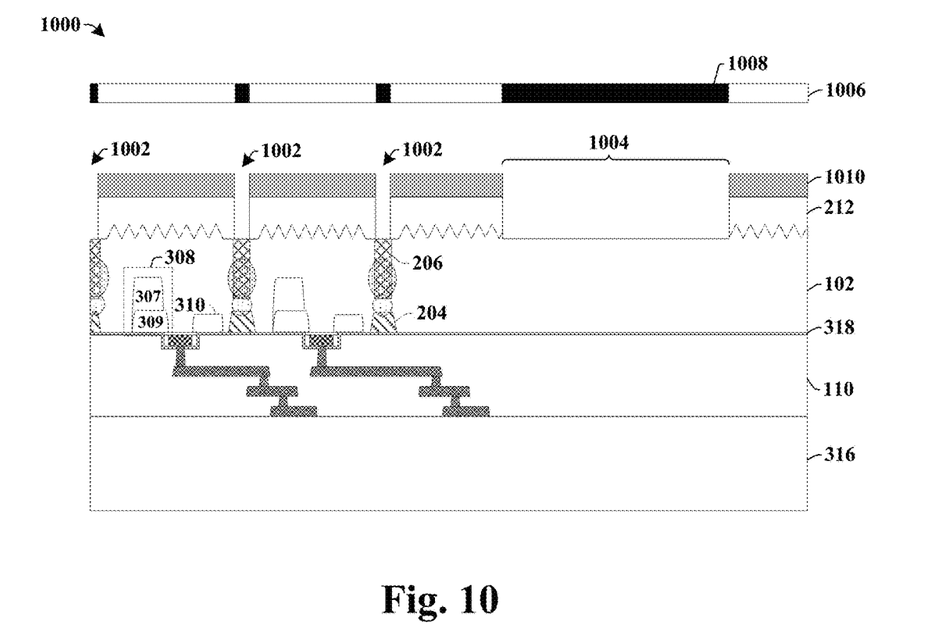

As shown in cross-sectional view 1000 of FIG. 10, the absorption enhancement structure 212 is selectively etched to concurrently form a plurality of grid structure openings 1002 and a ground structure opening 1004. In some embodiments, the plurality of grid structure openings 1002 have a smaller size (e.g., width and/or area) than the ground structure opening 1004. In some embodiments, the absorption enhancement structure 212 may be etched using a grid structure mask 1006 that selectively exposes a photosensitive masking layer 1010 (e.g., a photoresist layer), which is subsequently used as an etch mask. The grid structure mask 1006 comprises mask features 1008 (e.g., chrome features on a glass mask) associated with the plurality of grid structure openings 1002 and a ground structure opening 1004. Since both the grid structure openings 1002 and the ground structure opening 1004 extend through the absorption enhancement structure 212, the plurality of grid structure openings 1002 and the ground structure opening 1004 are able to be formed using a same mask, thereby allowing for cost efficient fabrication of a subsequent grid structure.

Figure 11:
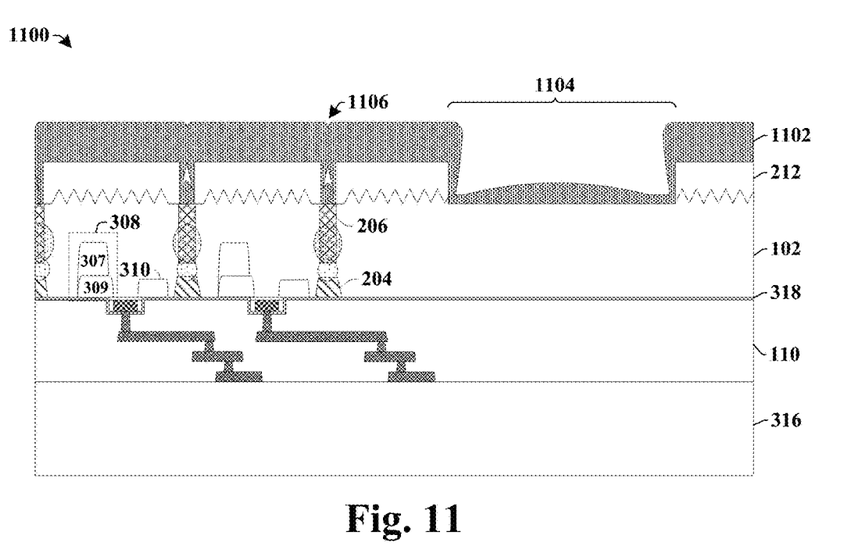

As shown in cross-sectional view 1100 of FIG. 11, a conductive material 1102 is deposited over the absorption enhancement structure 212. The conductive material 1102 extends over a top surface of the absorption enhancement structure 212 and to within the grid structure openings (1002 of FIG. 10) and the ground structure opening (1004 of FIG. 10). In some embodiments, due to a high aspect ratio of the grid structure openings (1002 of FIG. 10), one or more voids 326 may be formed within the conductive material 1102 between sidewalls of the absorption enhancement structure 212. The conductive material 1102 defines a depression 1104 within the ground structure opening (1004 of FIG. 10). In some embodiments, the conductive material 1102 may further define recesses 1106 arranged within an upper surface of the conductive material 1102 over the grid structure openings (1002 of FIG. 10). In some embodiments, the conductive material 1102 may comprise a metal, such as, aluminum, copper, tungsten, cobalt, silver, etc.

Figure 12:
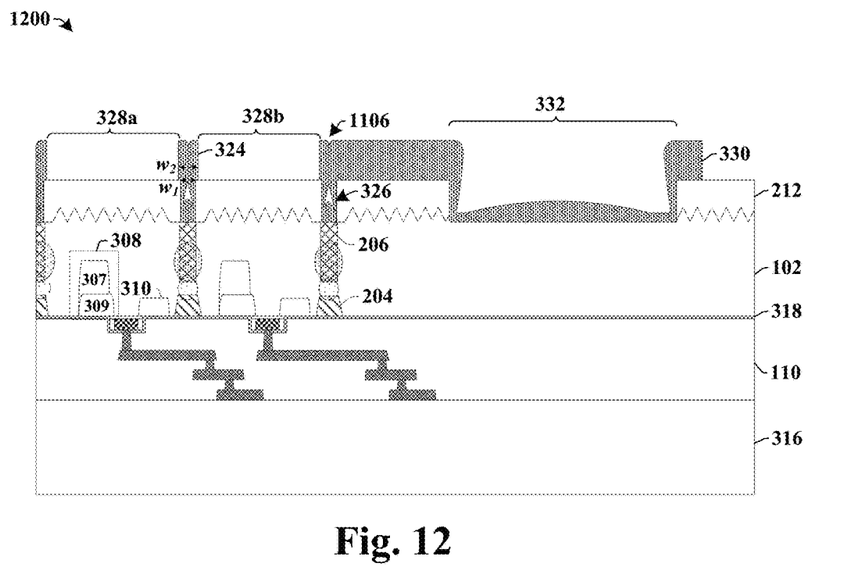

As shown in cross-sectional view 1200 of FIG. 12, the conductive material (1102 of FIG. 11) is selectively etched to form a grid structure 324 and a ground structure 330 within a ground region 332. The grid structure 324 defines openings 328a-328b overlying the photodiodes 308. In some embodiments, the grid structure 324 may comprise a first width $w_1$ within the absorption enhancement structure 212 and a second width $w_2$, which is larger than the first width $w_1$, above the absorption enhancement structure 212. In some embodiments, the conductive material (1102 of FIG. 11) may be selectively etched by exposing the conductive material to an etchant according to a masking layer (not shown).

Figure 13:
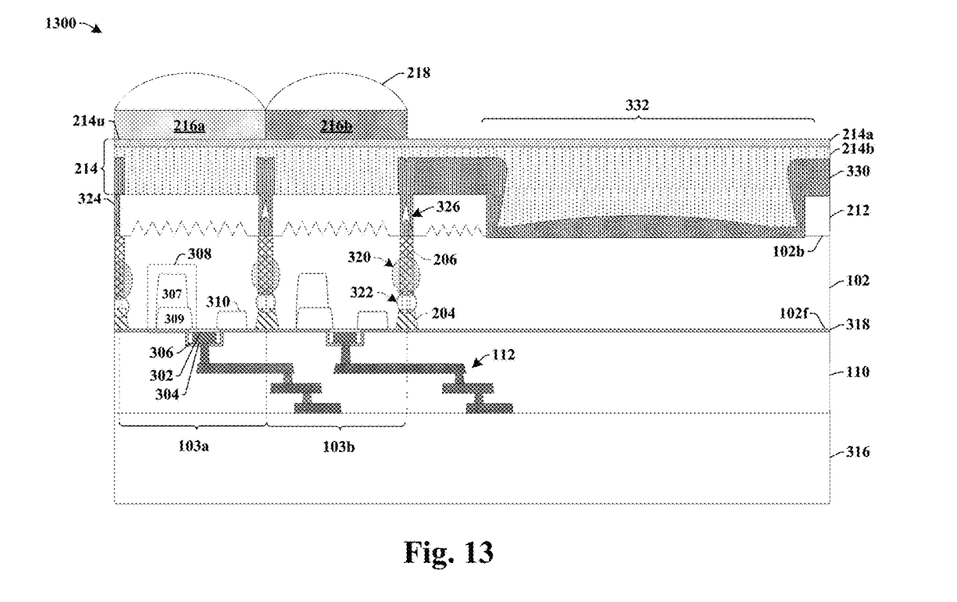

As shown in cross-sectional view 1300 of FIG. 13, a dielectric planarization structure 214 may be formed over the absorption enhancement structure 212. The dielectric planarization structure 214 fills the openings (openings 328a-328b of FIG. 12) defined by the grid structure 324 and a cavity defined within the ground region 332. The dielectric planarization structure 214 may further cover top surfaces of the grid structure 324 and the ground structure 330. In various embodiments, the dielectric planarization structure 214 may be formed by performing one or more deposition processes (e.g., CVD, PE-CVD, PVD, ALD, etc.) to form one or more stacked dielectric layers, 214a-214b. A planarization process (e.g., a chemical mechanical planarization process) may subsequently be performed after deposition of a top dielectric layer 214a to give the dielectric planarization structure 214 a substantially planar upper surface 214u. In some embodiments, the dielectric planarization structure 214 may be removed from within the ground region 332, while in other embodiments the dielectric planarization structure 214 may remain within the ground region 332. In some embodiments, the one or more stacked dielectric layers, 214a-214b, may comprise an oxide (e.g., $SiO_2$) or a nitride, for example.

A plurality of color filters 216a-216b are formed onto the dielectric planarization structure 214 at locations over the openings 328a-328b within the grid structure 324. In some embodiments, the plurality of color filters 216a-216b may be formed by forming a color filter layer and patterning the color filter layer. The color filter layer is formed of a material that allows for the transmission of radiation (e.g., light) having a specific range of wavelength, while blocking light of wavelengths outside of the specified range.

A plurality of micro-lenses 218 are formed over the plurality of color filters 216a-216b. In some embodiments, the plurality of micro-lenses 218 may be formed by depositing a micro-lens material above the plurality of color filters (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses 218 are then formed by selectively etching the micro-lens material according to the micro-lens template.

Figure 14:
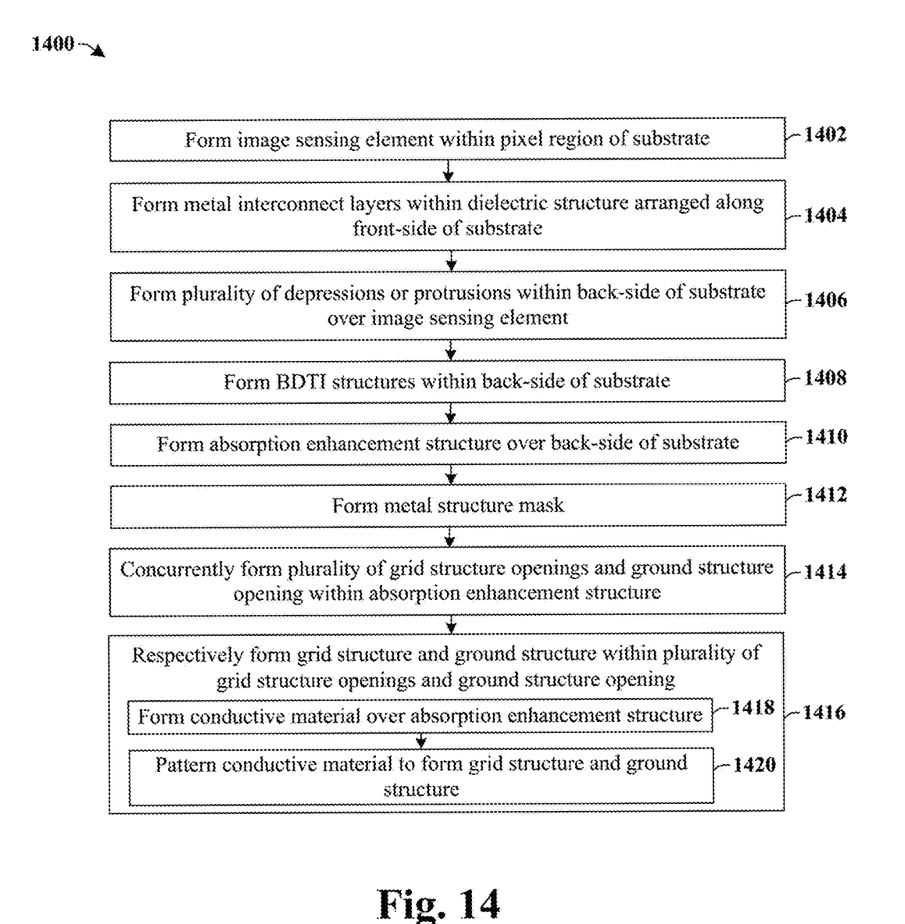
FIG. 14 illustrates a flow diagram of some embodiments of a method of forming an image sensor integrated chip comprising a grid structure configured to reduce crosstalk between pixel regions.

FIG. 14 illustrates a flow diagram of some embodiments of a method 1400 of forming an image sensor integrated chip comprising a grid structure configured to reduce crosstalk between pixel regions.

While disclosed method 1400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1402, an image sensing element is formed within a pixel region of a substrate. FIG. 4 illustrates a cross-sectional view 400 of some embodiments corresponding to act 1402.

At 1404, a plurality of metal interconnect layer are formed within a dielectric structure arranged along the front-side of the substrate. FIG. 5 illustrates a cross-sectional view 500 of some embodiments corresponding to act 1404.

At 1406, a plurality of depressions or protrusions are formed within a back-side of the substrate at a location overlying the image sensing element. The plurality of depressions or protrusions have a topography that increases absorption of radiation by the substrate. In some embodiments, the plurality of depressions or protrusions may be arranged in a periodic structure to define a silicon nano-pillar array (NPA) or an array of photonic crystals. FIG. 7 illustrates a cross-sectional view 700 of some embodiments corresponding to act 1406.

At 1408, back-side deep trench isolation (BDTI) structures are formed within the back-side of the substrate. FIG. 8 illustrates a cross-sectional view 800 of some embodiments corresponding to act 1408.

At 1410, an absorption enhancement structure is formed over the back-side of the substrate. FIG. 9 illustrates a cross-sectional view 900 of some embodiments corresponding to act 1410.

At 1412, a metal structure mask is formed. The metal structure mask that comprises mask features associated with openings within the absorption enhancement structure that define a ground structure and that also define a grid structure.

At 1414, the absorption enhancement structure is selectively etched based upon the metal structure mask to concurrently define a plurality of grid structure openings and a ground structure opening within the absorption enhancement structure. FIG. 10 illustrates a cross-sectional view 1000 of some embodiments corresponding to act 1414.

At 1416, a grid structure and ground structure are respectively formed within the plurality of grid structure openings and the ground structure opening within the absorption enhancement structure.

In some embodiments, the grid structure and the ground structure may be formed by forming a conductive material over the substrate, at 1418. The conductive material extends to within the plurality of grid structure openings and the ground structure opening and over a top surface of the absorption enhancement structure. FIG. 11 illustrates a cross-sectional view 1100 of some embodiments corresponding to act 1418.

The conductive material is subsequently etched to define the grid structure and the ground structure, at 1420. FIG. 12 illustrates a cross-sectional view 1200 of some embodiments corresponding to act 1420.

Therefore, the present disclosure relates to an image sensor integrated chip comprising a grid structure configured to reduce crosstalk between pixel regions of an image sensor chip.

In some embodiments, the present disclosure relates to an image sensor integrated chip. The integrated chip comprises an image sensing element arranged within a substrate. An absorption enhancement structure is arranged over a back-side of the substrate. A grid structure defining an opening is arranged over the image sensing element. The grid structure extends from over the absorption enhancement structure to a location within the absorption enhancement structure.

In other embodiments, the present disclosure relates to an image sensor integrated chip. The integrated chip comprises an image sensing element arranged within a substrate. A back-side of the substrate comprises a non-planar surface having a plurality of tapered depressions or protrusions arranged in a periodic pattern over the image sensing element. An absorption enhancement structure is arranged along the back-side of the substrate and comprises a non-planar surface facing the substrate. A dielectric structure comprising a plurality of metal interconnect layers is arranged along a front-side of the substrate. A grid structure defining an opening is arranged over the image sensing element. The grid structure extends from over the absorption enhancement structure to a location within the absorption enhancement structure.

In yet other embodiments, the present disclosure relates to a method of forming an image sensor integrated chip. The method comprises forming an image sensing element within a substrate, and forming an absorption enhancement structure over a back-side of the substrate. The method further comprises selectively etching the absorption enhancement structure to concurrently define a plurality of grid structure openings and a ground structure opening within the absorption enhancement structure. The method further comprises forming a grid structure and a ground structure within the plurality of grid structure openings and the ground structure opening, respectively. The grid structure extends from over the absorption enhancement structure to a location within the absorption enhancement structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor integrated chip, comprising:
an image sensing element arranged within a substrate;
an absorption enhancement structure arranged over a back-side of the substrate; and
a grid structure defining an opening arranged over the image sensing element, wherein the grid structure extends from over the absorption enhancement structure to a location within the absorption enhancement structure.

2. The integrated chip of claim 1, wherein the back-side of the substrate has a non-planar surface comprising a plurality of tapered depressions or protrusions arranged in a periodic pattern.

3. The integrated chip of claim 1, further comprising:
a dielectric planarization structure arranged over the absorption enhancement structure, wherein the dielectric planarization structure surrounds sidewalls and a top surface of the grid structure.

4. The integrated chip of claim 1, wherein the grid structure has a top surface overlying the absorption enhancement structure and a bottom surface that is within the absorption enhancement structure at a location vertically below an uppermost point of the substrate.

5. The integrated chip of claim 1, wherein the grid structure comprises a metal.

6. The integrated chip of claim 1, wherein the grid structure comprises a first width within the absorption enhancement structure and a second width, which is larger than the first width, above the absorption enhancement structure.

7. The integrated chip of claim 1, wherein the grid structure comprises a horizontal surface contacting an upper surface of the absorption enhancement structure.

8. The integrated chip of claim 1, wherein a recess is arranged along a top surface of the grid structure.

9. The integrated chip of claim 1, wherein the grid structure has a bottom surface that is substantially aligned with ledges arranged along the back-side of the substrate.

10. The integrated chip of claim 1, further comprising:
a dielectric structure comprising a plurality of metal interconnect layers arranged along a front-side of the substrate.

11. An image sensor integrated chip, comprising:
an image sensing element arranged within a substrate, wherein a back-side of the substrate comprises a non-planar surface having a plurality of tapered depressions or protrusions arranged in a periodic pattern over the image sensing element;
an absorption enhancement structure arranged along the back-side of the substrate and comprising a non-planar surface facing the substrate;
a dielectric structure comprising a plurality of metal interconnect layers arranged along a front-side of the substrate; and
a grid structure defining an opening arranged over the image sensing element, wherein the grid structure extends from over the absorption enhancement structure to a location within the absorption enhancement structure.

12. The integrated chip of claim 11, further comprising:
a dielectric layer arranged over the absorption enhancement structure at a location between sidewalls of the grid structure.

13. The integrated chip of claim 11, wherein the grid structure has a top surface overlying the absorption enhancement structure and a bottom surface that is within the absorption enhancement structure at a location vertically below an uppermost point of the substrate.

14. The integrated chip of claim 11, further comprising:
a plurality of back-side deep trench isolation structures extending from the back-side of the substrate to within the substrate, wherein the grid structure is disposed directly over the plurality of back-side deep trench isolation structures.

15. The integrated chip of claim 14, wherein the back-side of the substrate comprises ledges having a planar surface arranged between the back-side deep trench isolation structures and the non-planar surface.

16. The integrated chip of claim 15, wherein the grid structure has a top surface overlying the absorption enhancement structure and a bottom surface that is substantially aligned with the ledges.

17. The integrated chip of claim 11, wherein the grid structure comprises a first width within the absorption enhancement structure and a second width, which is larger than the first width, above the absorption enhancement structure.

18. An integrated chip, comprising:
an image sensing element arranged within a substrate, wherein the substrate has a back-side defining a plurality of tapered protrusions arranged in a periodic pattern;
an absorption enhancement structure arranged along the back-side of the substrate over and between the plurality of tapered protrusions; and
a grid structure having sidewalls that define an opening arranged over the image sensing element, wherein the grid structure extends from below tops of the tapered protrusions to over a top of the absorption enhancement structure.

19. The integrated chip of claim 18,
wherein sidewalls of adjacent ones of the plurality of tapered protrusions meet at a point arranged along a horizontal plane; and
wherein the grid structure extends from the horizontal plane to over the top of the absorption enhancement structure.

20. The integrated chip of claim 18, further comprising:
back-side deep trench isolation structures comprising one or more dielectric materials disposed within trenches extending into the back-side of the substrate on opposing sides of the image sensing element, wherein the grid structure has interior surfaces that define one or more voids arranged directly over the back-side deep trench isolation structures.

* * * * *